United States Patent
Clark et al.

(10) Patent No.: US 10,381,448 B2
(45) Date of Patent: Aug. 13, 2019

(54) WRAP-AROUND CONTACT INTEGRATION SCHEME

(71) Applicant: Tokyo Electron Limited, Minato-ku, Tokyo (JP)

(72) Inventors: Robert D. Clark, Livermore, CA (US); Kandabara N. Tapily, Mechanicville, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/604,399

(22) Filed: May 24, 2017

(65) Prior Publication Data
US 2017/0345904 A1    Nov. 30, 2017

Related U.S. Application Data

(60) Provisional application No. 62/341,807, filed on May 26, 2016.

(51) Int. Cl.
*H01L 21/02* (2006.01)
*H01L 29/16* (2006.01)
(Continued)

(52) U.S. Cl.
CPC .. *H01L 29/41791* (2013.01); *H01L 21/31111* (2013.01); *H01L 21/76802* (2013.01);
(Continued)

(58) Field of Classification Search
CPC ... H01L 29/417; H01L 21/311; H01L 21/768; H01L 29/45; H01L 29/16; H01L 29/78;
(Continued)

(56) References Cited

U.S. PATENT DOCUMENTS 4,707,218 A    11/1987    Giammarco et al.
7,671,394 B2    3/2010    Booth et al.
(Continued)

FOREIGN PATENT DOCUMENTS

JP    1997045768 A    2/1997
JP    2009032794 A    2/2009
JP    2009513007 A    3/2009

OTHER PUBLICATIONS

United States Patent and Trademark Office, Non-final Office Action for U.S. Appl. No. 15/191,912, dated Jan. 30, 2017, 12 pages.
(Continued)

*Primary Examiner* — Alexander O Williams

(57) ABSTRACT

A wrap-around contact integration scheme is described that includes sidewall protection during contact formation. A substrate processing method includes providing a substrate containing a raised contact in a first dielectric film, and a second dielectric film on the first dielectric film, where the second dielectric film has a recessed feature with a sidewall and a bottom portion above the raised contact. The method further includes depositing a conformal film on the sidewall and on the bottom portion of the recessed feature, removing the conformal film from the bottom portion in a first anisotropic etching process, where the remaining conformal film forms a protection film on the sidewall and defines a width of the recessed feature, and forming a cavity containing the raised contact in an isotropic etching process, where a width of the cavity is greater than the width of the recessed feature.

20 Claims, 5 Drawing Sheets

(51) Int. Cl.
*H01L 29/45* (2006.01)
*H01L 29/66* (2006.01)
*H01L 29/78* (2006.01)
*H01L 21/311* (2006.01)
*H01L 21/768* (2006.01)
*H01L 23/485* (2006.01)
*H01L 29/161* (2006.01)
*H01L 29/417* (2006.01)

(52) U.S. Cl.
CPC .. *H01L 21/76816* (2013.01); *H01L 21/76831* (2013.01); *H01L 21/76843* (2013.01); *H01L 21/76846* (2013.01); *H01L 21/76877* (2013.01); *H01L 23/485* (2013.01); *H01L 29/161* (2013.01); *H01L 29/1608* (2013.01); *H01L 29/41783* (2013.01); *H01L 29/45* (2013.01); *H01L 29/66795* (2013.01); *H01L 29/7851* (2013.01); *H01L 21/02178* (2013.01); *H01L 21/02181* (2013.01); *H01L 21/02186* (2013.01); *H01L 21/02189* (2013.01); *H01L 2029/7858* (2013.01)

(58) Field of Classification Search
CPC ....... H01L 29/66; H01L 21/02; H01L 29/161; H01L 29/41791; H01L 29/7851; H01L 21/31111; H01L 21/76802; H01L 21/76843; H01L 21/76846; H01L 29/66795; H01L 29/41783; H01L 29/1608; H01L 21/76877; H01L 21/02186; H01L 21/02189; H01L 21/02181; H01L 21/02178

USPC ........................................................ 257/751
See application file for complete search history.

(56) References Cited

U.S. PATENT DOCUMENTS

| | | | |
|---|---|---|---|
| 9,837,304 | B2 | 12/2017 | Clark et al. |
| 2001/0002331 | A1 | 5/2001 | Miyata |
| 2003/0064585 | A1 | 4/2003 | Wu et al. |
| 2006/0049132 | A1 | 3/2006 | Wu et al. |
| 2008/0258237 | A1 | 10/2008 | Kim |
| 2009/0286402 | A1 | 11/2009 | Xia et al. |
| 2011/0248326 | A1 | 10/2011 | Kanakasabapathy et al. |
| 2013/0115778 | A1 | 5/2013 | Xue et al. |
| 2013/0270713 | A1 | 10/2013 | Liao et al. |
| 2015/0206754 | A1* | 7/2015 | Horak ............... H01L 21/28008 257/288 |
| 2015/0235859 | A1 | 8/2015 | Armbruster et al. |
| 2015/0340495 | A1* | 11/2015 | Basu .................. H01L 29/7827 257/329 |
| 2016/0141423 | A1 | 5/2016 | Diaz et al. |

OTHER PUBLICATIONS

Japan Patent Office, Official Action for Japanese patent application No. 2017-103717, dated Mar. 20, 2018, 3 pages.
Korean Intellectual Property Office, Office Action for korean patent application No. 10-2017-0065429, dated Jun. 21, 2018, 15 pages.

\* cited by examiner

WRAP-AROUND CONTACT INTEGRATION SCHEME

CROSS-REFERENCE TO RELATED APPLICATIONS

This application is related to and claims priority to U.S. Provisional Patent Application Ser. No. 62/341,807 filed on May 26, 2016, the entire contents of which are herein incorporated by reference.

FIELD OF INVENTION

The present invention relates to the field of semiconductor manufacturing and semiconductor devices, and more particularly, to a wrap-around contact integration scheme that includes sidewall protection during contact formation.

BACKGROUND OF THE INVENTION

Current and future generations of metal-oxide-semiconductor field-effect transistors (MOSFETs) require tight control of parasitic capacitance while simultaneously optimizing metal-semiconductor contact resistance. In FinFET structures, maximizing the contact area can be achieved by creating a contact that wraps around the fin or by growing faceted epitaxial contacts, and then wrapping metal around the faceted epitaxial contacts. The adoption of ultra-thin transistor body structures such as FinFET and fully depleted silicon-on-insulator (FDSOI) has exacerbated the problem for logic manufacturing. In order to reduce contact resistance in FinFET structures, device makers are contemplating Wrap-Around Contact (WAC) structures that allow metal-semiconductor contacts with increased area.

SUMMARY OF THE INVENTION

Embodiments of the invention provide a wrap-around contact integration scheme that includes sidewall protection during contact formation. According to one embodiment, a substrate processing method includes providing a substrate containing a raised contact in a first dielectric film, and a second dielectric film on the first dielectric film, where the second dielectric film has a recessed feature with a sidewall and a bottom portion above the raised contact. The method further includes depositing a conformal film on the sidewall and on the bottom portion of the recessed feature, removing the conformal film from the bottom portion in a first anisotropic etching process, where the remaining conformal film forms a protection film on the sidewall and defines a width of the recessed feature, and forming a cavity containing the raised contact in an isotropic etching process, where a width of the cavity is greater than the width of the recessed feature.

According to one embodiment, the substrate processing method includes providing a substrate containing a raised contact in a first dielectric film, and a second dielectric film on the first dielectric film, where the second dielectric film has a recessed feature with a sidewall and a bottom portion above the raised contact. The method further includes depositing a conformal metal oxide film on the sidewall and on the bottom portion, removing the conformal film from the bottom portion in a first anisotropic etching process, where the remaining conformal film forms a protection film on the sidewall and defines a width of the recessed feature, extending the recessed feature to the raised contact using a second anisotropic etching process, forming a cavity containing the raised contact in an isotropic etching process, where a width of the cavity is greater than the width of the recessed feature, and filling the recessed feature and the cavity with a metal.

According to one embodiment, semiconductor device is described that includes a substrate containing a raised contact in a cavity in a first dielectric film, and a second dielectric film on the first dielectric film, where the second dielectric film has a recessed feature with a sidewall above the raised contact, a protection film on the sidewall, the protection film defining a width of the recessed feature, and a metal filling the cavity and the recessed feature, wherein a width of the cavity is greater than the width of the recessed feature.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Figure 1:
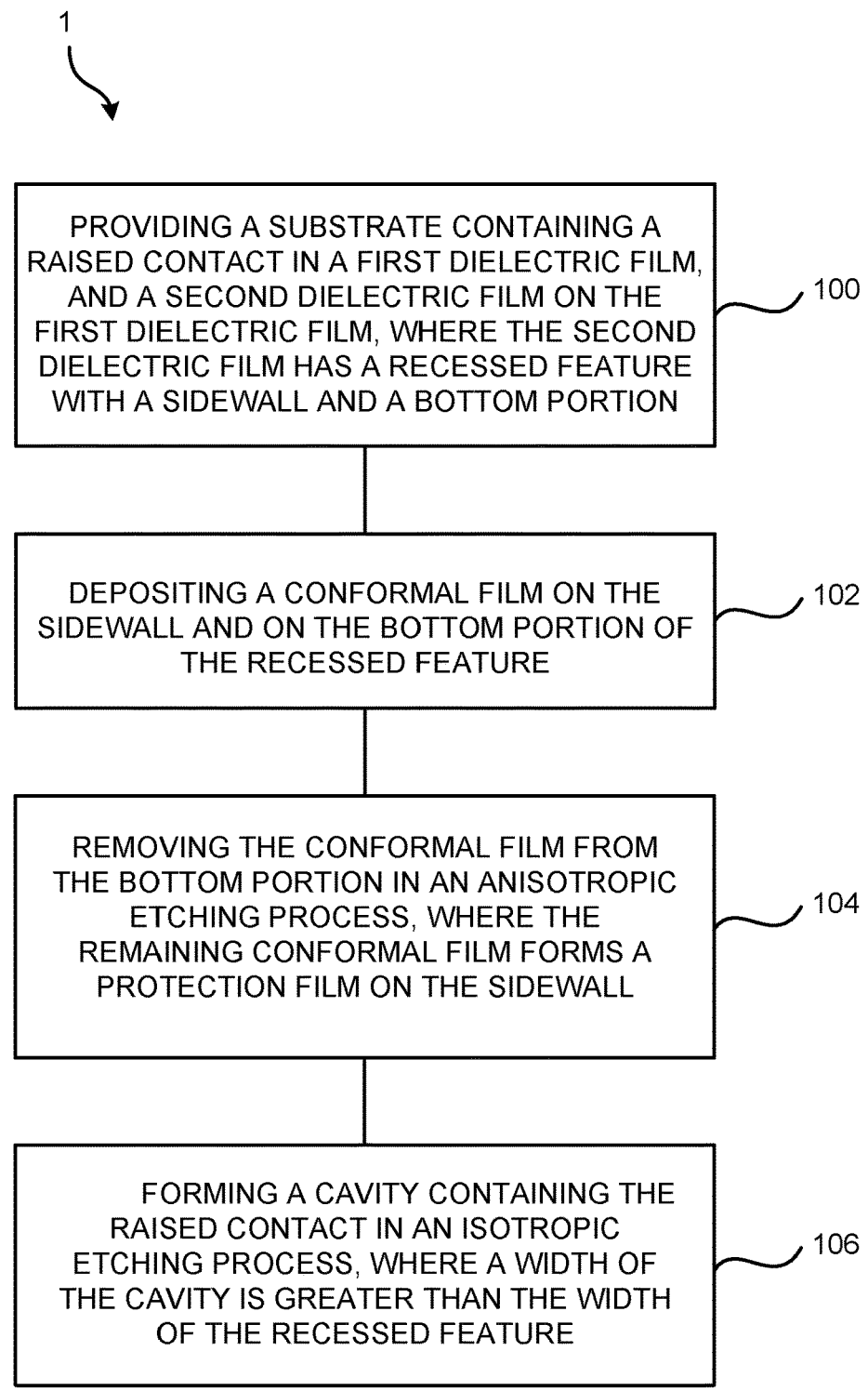
FIG. 1 is a process flow diagram for a method of processing a substrate according to an embodiment of the invention.

FIG. 1 is a process flow 1 for a method of processing a substrate according to an embodiment of the invention, and FIGS. 2A-2G schematically show through cross-sectional views a method of processing a substrate according to an embodiment of the invention. The method includes, in 100, providing a substrate containing a raised contact 216 in a first dielectric film 200, and a second dielectric film 202 on the first dielectric film 200, where the second dielectric film 202 has a recessed feature 204 with a sidewall 201 and a bottom portion 203 above the raised contact 216. The substrate further includes an etch stop layer 212 on the first dielectric film 200, and a dielectric film 218 underneath the first dielectric film 200. The etch stop layer 212 may be used to terminate the etching during the formation of the recessed feature 204. The etch stop layer 212 may, for example, include a high-k material, silicon nitride, silicon oxide, carbon, or silicon.

The recessed feature 204 can, for example, have a width 207 that is less than 200 nm, less than 100 nm, less than 50 nm, less than 25 nm, less than 20 nm, or less than 10 nm. In other examples, the recessed feature 204 can have a width 207 that is between 5 nm and 10 nm, between 10 nm and 20 nm, between 20 nm and 50 nm, between 50 nm and 100 nm, between 100 nm and 200 nm, between 10 nm and 50 nm, or between 10 nm and 100 nm. The width 207 can also be referred to as a critical dimension (CD). The recessed feature 204 can, for example, have a depth of 25 nm, 50 nm, 100 nm, 200 nm, or greater than 200 nm. In some examples, the first dielectric film 200 may contain $SiO_2$, SiON, SiN, a high-k material, a low-k material, or an ultra-low-k material. In some examples, the second dielectric film 202 may contain $SiO_2$, SiON, SiN, a high-k material, a low-k material, or an ultra-low-k material. In one example, the raised contact includes SiGe or SiC.

The recessed feature 204 in the second dielectric film 202 may be formed using well-known lithography and etching processes. Although not shown in FIG. 2A, a patterned mask layer may be present on the field area 211 and defining the opening of the recessed feature 204.

Figure 2A:
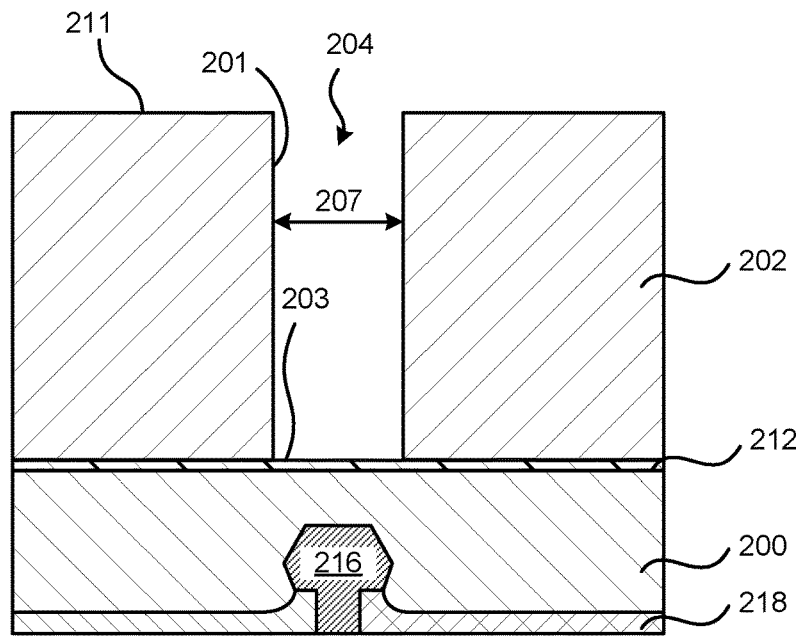
FIGS. 2A-2G schematically show through cross-sectional views a method of processing a substrate according to an embodiment of the invention.
Figure 2B:
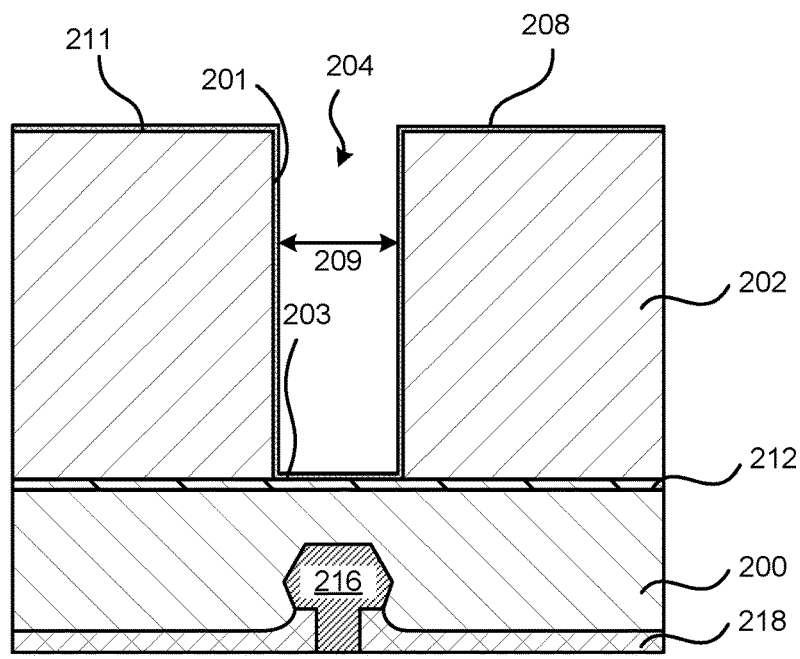

The process flow 1 further includes, in 102, depositing a conformal film 208 on the sidewall 201 and on the bottom portion 203. This is schematically shown in FIG. 2B. According to one embodiment, the conformal film 208 may be deposited by atomic layer deposition (ALD). ALD can deposit very thin films with atomic level thickness control and excellent conformality over advanced raised and recessed features. According to one embodiment, the conformal film 208 can include a metal oxide film. The metal oxide film can be a high-k film. In one example, the metal oxide film may be selected from the group consisting of $HfO_2$, $ZrO_2$, $TiO_2$, $Al_2O_3$, and a combination thereof. However, other metal oxide films may be used. According to another embodiment, the conformal film 208 may be selected from the group consisting of a metal oxide film, a metal nitride film, a metal oxynitride film, a metal silicate film, and a combination thereof.

In one example, the conformal film 208 includes a metal oxide film that is deposited using ALD by a) pulsing a metal-containing precursor into a process chamber containing the substrate, b) purging the process chamber with an inert gas; c) pulsing an oxygen-containing precursor into the process chamber, d) purging the process chamber with an inert gas, and e) repeating a)-d) at least once.

A thickness of the conformal film 208 may be selected to provide adequate protection against etching of the sidewall 201 during a) a cleaning process that may be carried out to remove residue from the recessed feature 204, and/or b) during etching of the etch stop layer 212 and the first dielectric film 200. In some examples, a thickness of the conformal film 208 can be 10 nm or less, 5 nm or less, 4 nm or less, between 1 nm and 2 nm, between 2 nm and 4 nm, between 4 nm and 6 nm, between 6 nm and 8 nm, or between 2 nm and 6 nm. The presence of the conformal film 208 on the sidewall 201 reduces the width 207 of the recessed feature 204 to a width 209. However, this change in width can be relatively small since the conformal film 208 may be only a few nm thick.

Figure 2C:
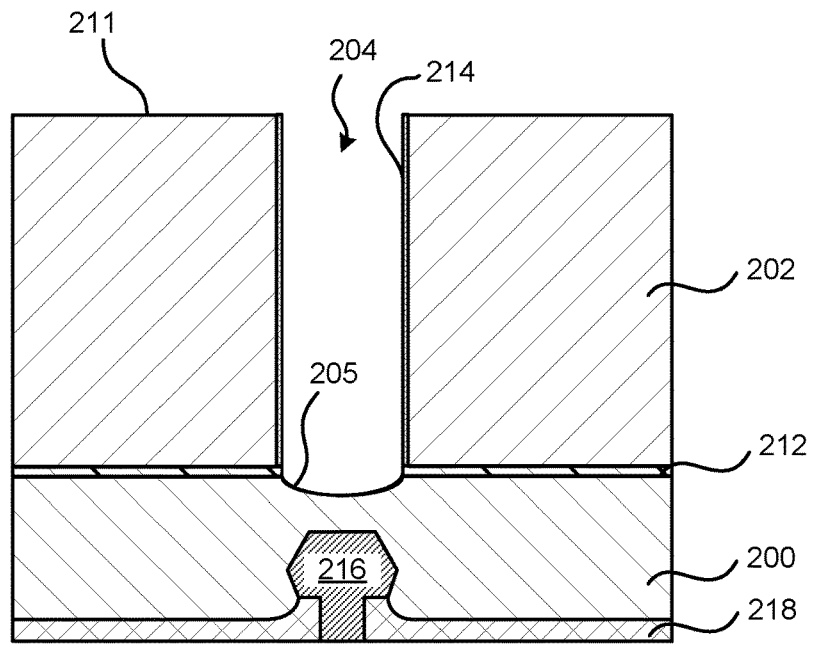

The process flow 1 further includes, in 104, removing the conformal film 208 from the bottom portion 203 in a first anisotropic etching process, where the remaining conformal film forms a protection film 214 on the sidewall 201 of the recessed feature 204. This is schematically shown in FIG. 2C. The first anisotropic etching process may utilize a dry etching process that is directional and thus etches the conformal film 208 faster from the field area 211 and the bottom portion 203 than from the sidewall 201. In one example, the first anisotropic etching process can include a digital etching process or a plasma-enhanced atomic layer etching (PEALE). According to one embodiment, the first anisotropic etching process can include alternating exposures of $BCl_3$ gas and plasma-excited argon gas. The first anisotropic etching process forms a recess 205 in the first dielectric film 200 following the removal of the conformal film 208 from the bottom portion 203. This is schematically shown in FIG. 2C.

Figure 2D:
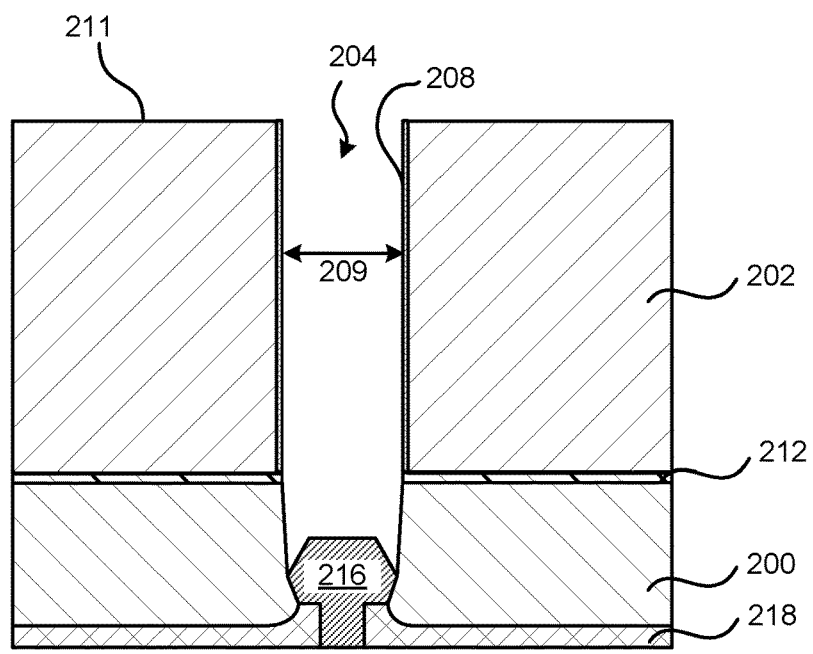

The method further includes extending the recessed feature 204 to the raised contact 216 in the first dielectric film 200 using a second anisotropic etching process. This is schematically shown in FIG. 2D. The protection film 214 has adequate thickness and etch resistance to prevent or reduce etching of the sidewall 201 during the second anisotropic etching process, thus preventing loss of critical dimension.

Figure 2E:
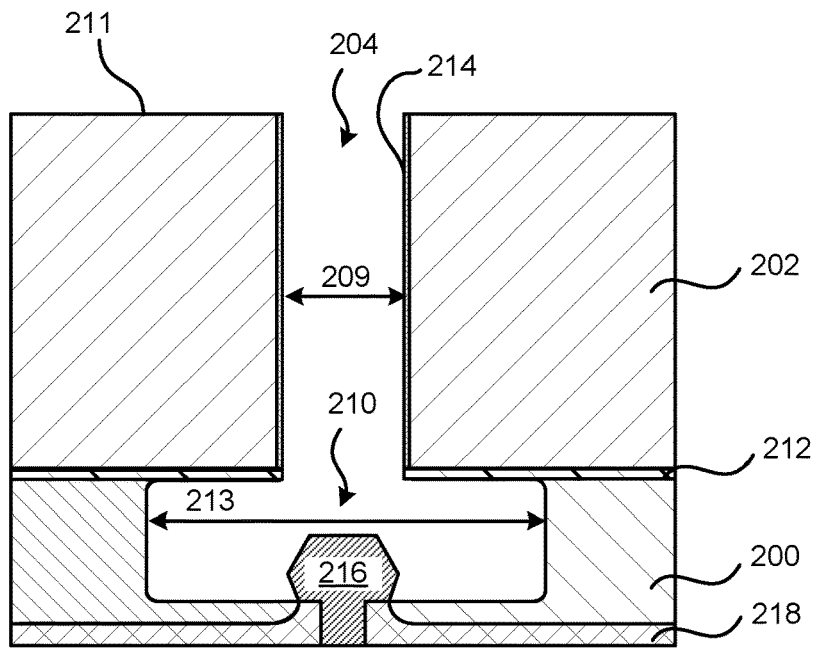

The process flow 1 further includes, in 106, forming a cavity 210 containing the raised contact 216 in an isotropic etching process, where a width 211 of the cavity 210 is greater than the width 209 of the recessed feature 204. This is schematically shown in FIG. 2E. In one example, the isotropic etching process can include thermal atomic layer etching (ALE).

Figure 2F:
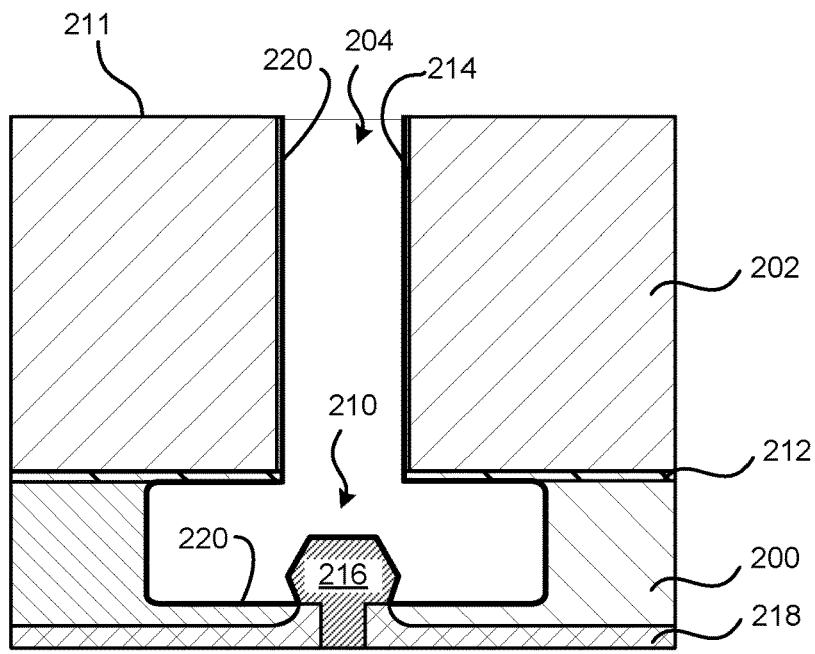

According to one embodiment, the method can further include depositing a barrier layer 220 on the protection film 214 in the recessed feature 204 and on surfaces in the cavity 210. In one example, the barrier layer 220 can include a Ti layer, a TiN layer, or both a Ti layer and a TiN layer. This is schematically shown in FIG. 2F.

Figure 2G:
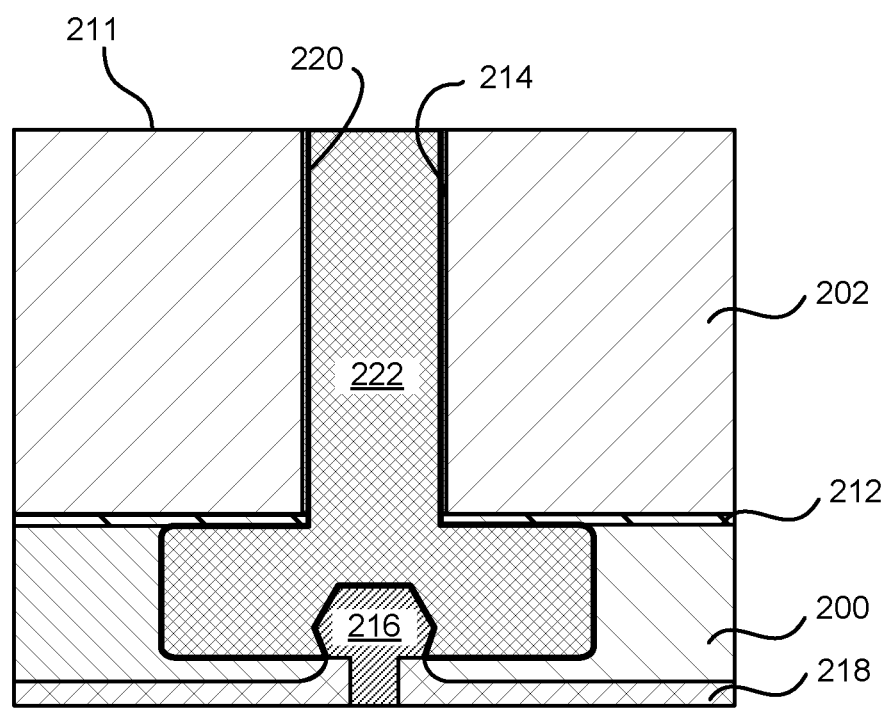

According to one embodiment, the method further includes filling the recessed feature 204 and the cavity 210 with a metal 222 that wraps around the raised contact 216. The metal may, for example, be selected from the group consisting of tungsten (W) and copper (Cu). This is schematically shown in FIG. 2G.

According to one embodiment, the protection film 214 may be removed from the recessed feature 204 prior to depositing a barrier layer and filling the recessed feature with the metal 222. According to one embodiment, the protection film 214 may be removed using an exposure of $BCl_3$ gas and plasma-excited argon gas.

A wrap-around contact integration scheme that includes sidewall protection during contact formation has been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
   providing a substrate containing a raised contact in a first dielectric film, and a second dielectric film on the first dielectric film, wherein the second dielectric film has a recessed feature with a sidewall and a bottom portion above the raised contact, wherein the raised contact is buried under the first dielectric film;
   depositing a conformal film on the sidewall and on the bottom portion of the recessed feature;
   removing the conformal film from the bottom portion in a first anisotropic etching process, wherein the remaining conformal film forms a protection film on the sidewall and defines a width of the recessed feature;
   extending the recessed feature to the raised contact in the first dielectric film and exposing the raised contact using a second anisotropic etching process; and
   forming a cavity containing the raised contact in an isotropic etching process, wherein a width of the cavity is greater than the width of the recessed feature.

2. The method of claim 1, further comprising:
   depositing barrier layer in the recessed feature and in the cavity.

3. The method of claim 2, wherein the barrier layer includes a Ti layer, a TiN layer, or both a Ti layer and a TiN layer.

4. The method of claim 1, further comprising:
filling the recessed feature and the cavity with a metal.

5. The method of claim 4, wherein the metal is selected from the group consisting of tungsten (W) and copper (Cu).

6. The method of claim 4, further comprising:
prior to the filling, removing the protection film from the recessed feature.

7. The method of claim 1, wherein the first dielectric film, the second dielectric film, or both the first and second dielectric films, include $SiO_2$.

8. The method of claim 1, wherein the conformal film includes a metal oxide film selected from the group consisting of $HfO_2$, $ZrO_2$, $TiO_2$, $Al_2O_3$, and a combination thereof.

9. The method of claim 1, wherein the raised contact includes SiGe or SiC.

10. A substrate processing method, comprising:
providing a substrate containing a raised contact in a first dielectric film, and a second dielectric film on the first dielectric film, wherein the second dielectric film has a recessed feature with a sidewall and a bottom portion above the raised contact, wherein the raised contact is buried under the first dielectric film;
depositing a conformal metal oxide film on the sidewall and on the bottom portion;
removing the conformal film from the bottom portion in a first anisotropic etching process, wherein the remaining conformal film forms a protection film on the sidewall and defines a width of the recessed feature;
extending the recessed feature to the raised contact and exposing the raised contact using a second anisotropic etching process;
forming a cavity containing the raised contact in an isotropic etching process, wherein a width of the cavity is greater than the width of the recessed feature; and
filling the recessed feature and the cavity with a metal.

11. The method of claim 10, further comprising:
depositing barrier layer in the recessed feature and in the cavity.

12. The method of claim 11, wherein the barrier layer includes a Ti layer, a TiN layer, or both a Ti layer and a TiN layer.

13. The method of claim 10, wherein the metal is selected from the group consisting of tungsten (W) and copper (Cu).

14. The method of claim 10, further comprising:
prior to the filling, removing the protection film from the recessed feature.

15. The method of claim 10, wherein the conformal metal oxide film is selected from the group consisting of $HfO_2$, $ZrO_2$, $TiO_2$, $Al_2O_3$, and a combination thereof.

16. The method of claim 10, wherein the raised contact includes SiGe or SiC.

17. A substrate processing method, comprising:
providing a substrate containing a raised contact in a first dielectric film, and a second dielectric film on the first dielectric film, wherein the second dielectric film has a recessed feature with a sidewall and a bottom portion above the raised contact, wherein the raised contact is buried under the first dielectric film;
depositing a conformal film on the sidewall and on the bottom portion of the recessed feature;
removing the conformal film from the bottom portion in a first anisotropic etching process, wherein the remaining conformal film forms a protection film on the sidewall and defines a width of the recessed feature;
forming a cavity containing the raised contact in an isotropic etching process, wherein a width of the cavity is greater than the width of the recessed feature; and
depositing barrier layer in the recessed feature and in the cavity.

18. The method of claim 17, wherein the barrier layer includes a Ti layer, a TiN layer, or both a Ti layer and a TiN layer.

19. The method of claim 17, further comprising:
filling the recessed feature and the cavity with a metal.

20. The method of claim 1, wherein the conformal film is selected from the group consisting of a metal oxide film, a metal nitride film, a metal oxynitride film, a metal silicate film, and a combination thereof.

* * * * *